United States Patent [19]
Matsuoka

[11] Patent Number: 5,447,444
[45] Date of Patent: Sep. 5, 1995

[54] IC SOCKET

[75] Inventor: Noriyuki Matsuoka, Yokohama, Japan

[73] Assignee: Yamaichi Electronics Co., Ltd., Tokyo, Japan

[21] Appl. No.: 172,743

[22] Filed: Dec. 27, 1993

[30] Foreign Application Priority Data

Dec. 26, 1992 [JP] Japan .................................. 4-359082

[51] Int. Cl.⁶ .......................................... H01R 11/22
[52] U.S. Cl. ..................................... 439/266; 439/160
[58] Field of Search .................. 439/70, 72, 266, 269, 439/264, 160

[56] References Cited

U.S. PATENT DOCUMENTS

| | | |
|---|---|---|
| 4,031,295 | 6/1977 | Rigazio . |
| 4,498,047 | 2/1985 | Hexamer et al. . |
| 4,623,208 | 11/1986 | Kerul et al. . |
| 4,669,796 | 6/1987 | Carter . |
| 4,832,610 | 5/1989 | Matsuoka . |
| 4,846,703 | 7/1989 | Matsuoka et al. . |
| 4,846,704 | 7/1989 | Ikeya ................. 439/266 X |
| 4,886,470 | 12/1989 | Billman et al. .............. 439/266 OR |
| 5,076,798 | 12/1991 | Uratsuji ........................... 439/266 X |
| 5,186,641 | 2/1993 | Uratsuji ....................... 439/266 OR |
| 5,195,903 | 3/1993 | Uratsuji ....................... 439/266 OR |
| 5,290,192 | 3/1994 | Espenshade et al. . |
| 5,304,072 | 4/1994 | Kunioka et al. . |

FOREIGN PATENT DOCUMENTS

4-154065  5/1992  Japan .
2119173 11/1983  United Kingdom .

Primary Examiner—Larry I. Schwartz
Assistant Examiner—Daniel Wittels
Attorney, Agent, or Firm—Wenderoth, Lind & Ponack

[57] ABSTRACT

An IC socket comprises an IC package receiving portion, a plurality of contact members arranged along the IC package receiving portion, and a contact shutter member for displacing the contact members between a position for contacting leads of the IC package and a releasing position. The improvement comprises a lifter operatively connected to the contact shutter member so as to be displaced between a position above and a position below the contacting position. The lifter receives the IC package in the position above the contacting position and delivers the IC package onto a support platform of the IC package receiving portion while being displaced to the position below the contacting position.

13 Claims, 8 Drawing Sheets

IC SOCKET

BACKGROUND OF THE INVENTION

1. Field of the Invention

This invention relates to an IC socket in which contact members are displaced by a contact shutter member so that the electrical contact is established or broken between the contact members and leads of an IC package.

2. Brief Description of the Prior Art

There is known an IC socket as disclosed, for example, in an official gazette of Japanese Early Laid-Open Patent Application No. Hei 4-154065, in which an IC package is put into an IC package receiving portion from above and the electrical contact between each of the contact members and leads of the IC package is established and broken by a contact shutter member displacing the contact members forwardly and rearwardly.

However, the above-mentioned prior art has the following shortcomings. When the IC package is dropped into the IC package receiving portion, the IC package tends to rebound in the IC receiving portion with the result that the leads of the IC package are poorly positioned relative to the corresponding contact members and the leads are deformed due to impact or shock therefrom, thereby causing poor electrical contact between the contact members and the leads.

SUMMARY OF THE INVENTION

It is therefore an object of the present invention to provide an IC socket, in which contact members are operatively connected to a contact shutter member to correctly receive an IC package in an IC receiving portion before the contact members come into electrical contact with leads of the IC package, so that the contact members may be brought into contact with the leads properly.

To achieve the above object, there is essentially provided an IC socket comprising an IC package receiving portion, a plurality of contact members arranged along the IC package receiving portion, and a contact shutter member for displacing the contact members between a contacting position in which they contact leads of the IC package and a releasing position. The improvement further comprises a lifter operatively connected to the contact shutter member so as to be displaced between a position above and a position below the contacting position (i.e. between an upper contacting position and a lower contacting position), the lifter receiving the IC package in the position above the contacting position and delivering the IC package onto a support platform of the IC package receiving portion while being displaced to the position below the contacting position.

From another aspect of the invention, there is also provided an IC socket comprising an IC package receiving portion, a plurality of contact members arranged along the IC package receiving portion, and a contact shutter lever for displacing the contact members between a contacting position in which they contact leads of the IC package and a releasing position. The improvement is characterized in that the contact shutter lever is provide d with a lifter operatively connected to the contact shutter lever so as to be displaced between a position above and a position below the contacting position, and a positioning member operatively connected to the contact shutter lever to restrict the body or the leads of the IC package. The lifter receives and supports the IC package in the position above the contacting position and delivers the IC package onto a support platform of the IC package receiving portion while being displaced to the position below the contacting position, the positioning member restricting the leads, etc. before the contact member is brought into contact with the leads.

With the above-mentioned construction of the present invention, when the contact member is displaced from the contacting position to the releasing position by the contact shutter member, the lifter is displaced into the upper position above the contacting position. In that condition, when the IC package is supported on the lifter and then the contact member is displaced from the releasing position to the contacting position side by the contact shutter member, the lifter is displaced into the position below the contacting position. During this process, after the IC package is delivered and placed onto the support platform of the IC package receiving portion, the contact member is brought into contact with the lead of the IC package.

According to the construction in which the lifter and the positioning member are provided on the contact shutter member engageable with the contact member, the contact member is displaced from the contacting position to the releasing position by the contact shutter lever, and the lifter is displaced to the position above the contacting position so that the IC package is supported on this lifter. Then, when the contact member is displaced from the releasing position to the contacting position side by the contact shutter lever, the lifter delivers the IC package to the IC package receiving portion while being displaced to the position below the contacting position, and after the body or lead of this IC package is restricted by the positioning member so as to correctly position the lead relative to the contact member, the contact is brought into contact with the lead.

DETAILED DESCRIPTION OF THE EMBODIMENTS

FIGS. 1 through 8 shows an IC socket according to a first embodiment of the present invention.

Figure 1:
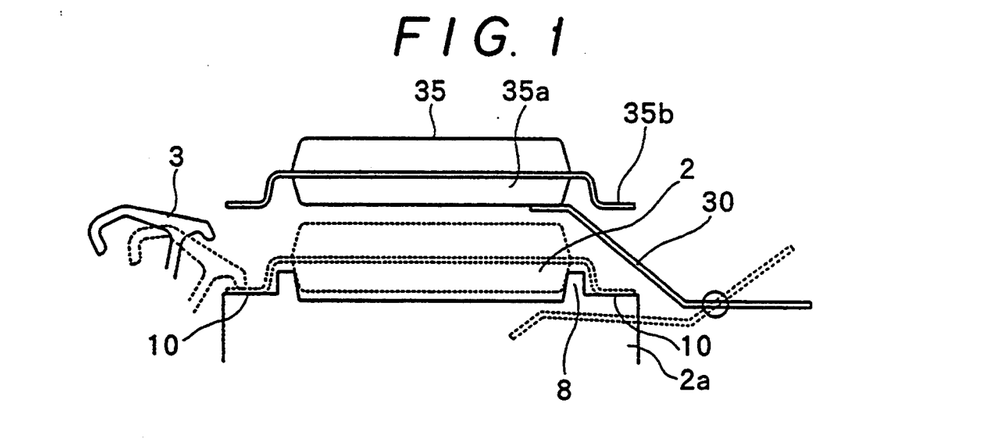
FIG. 1 is a side view showing the principle of an IC socket according to a first embodiment of the present invention.

As shown in FIG. 1, this IC socket has a contact shutter member for displacing a contact member 3 between a contacting position where the contact member 3 is brought into contact with a lead 35b of an IC package 35 and a releasing position where the contact member does not interfere with the IC package 35 being received in the IC package receiving portion 2, and a lifter operatively connected to the contact shutter member so as to be displaced between an upper position (i.e. a position above the contacting position) and a lower position (i.e. a position below the contacting position).

The lifter 30 receives and supports a body 35a of the IC package 35 in the upper position above the contacting position as indicated by a solid line, and delivers the lead 35b of the IC package 35 onto an upper surface (IC receiving surface) of a support platform 2a, i.e., a lead support surface 10, of an IC package receiving portion 2 while being displaced into a lower position below the contacting position as indicated by a dotted line. Thereafter the contact member 3 is displaced forwardly from a position as indicated by a solid line to a position as indicated by a dotted line so that the lead 35b of the IC package 35 is held between the contact member 3 and the lead support surface 10.

Although only one side of the contact member 3 and the lifter 30 is shown for the purpose of simplification, the lifters 30 are of course arranged in such a manner as to support opposing sides of a lower surface of the body 35a of the IC package 35.

Figure 2:
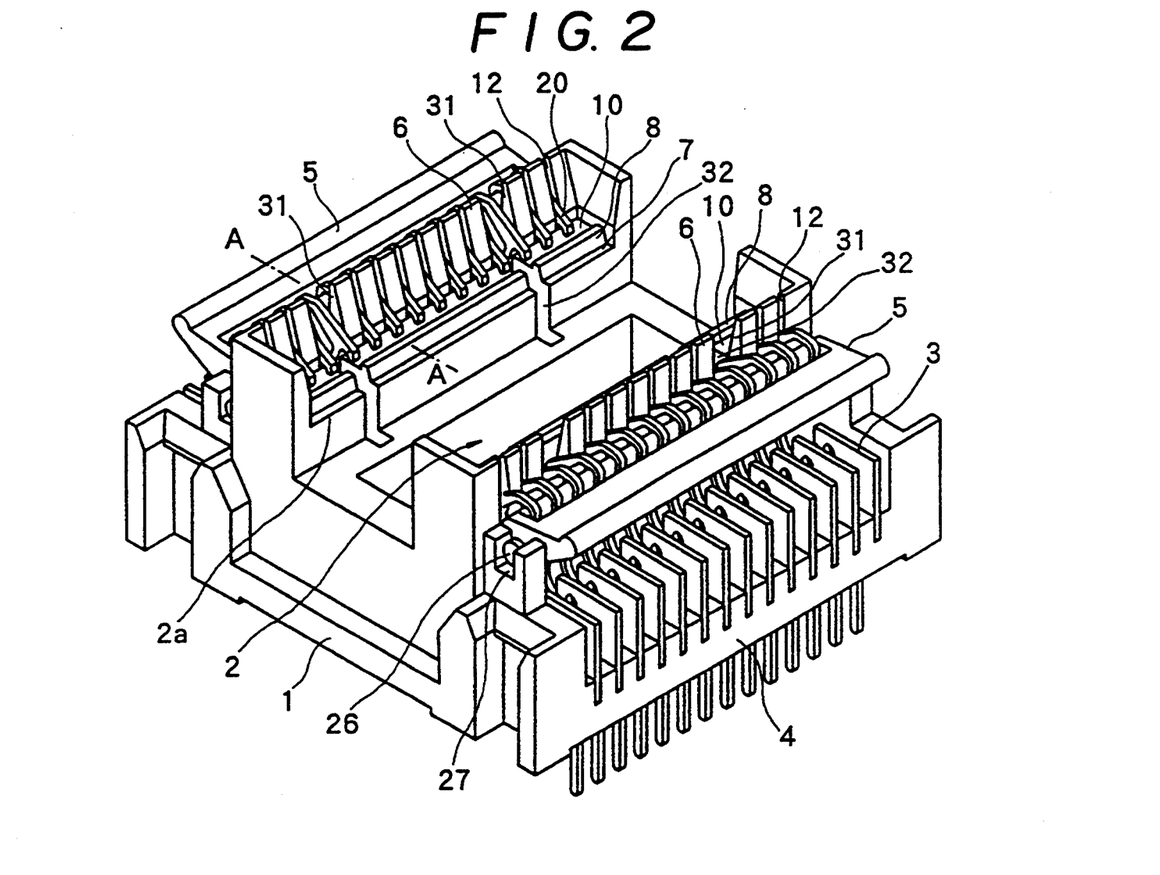
FIG. 2 is a perspective view showing the IC socket according to the first embodiment of the present invention.
Figure 3:
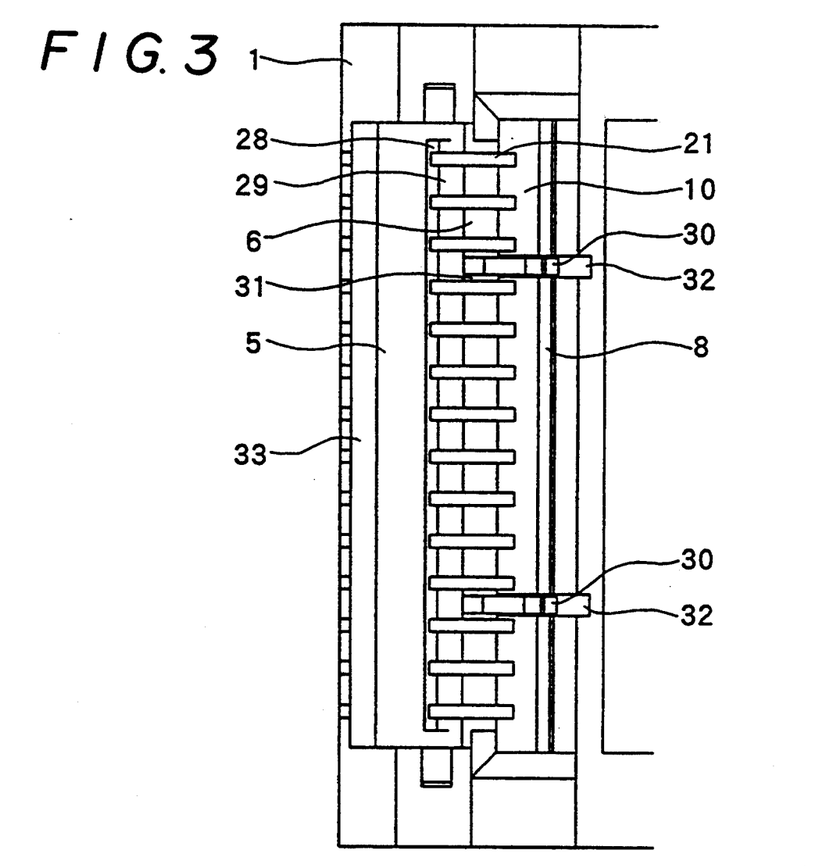
FIG. 3 is a plan view showing an important portion of the IC socket according to the first embodiment of the present invention.
Figure 5A:
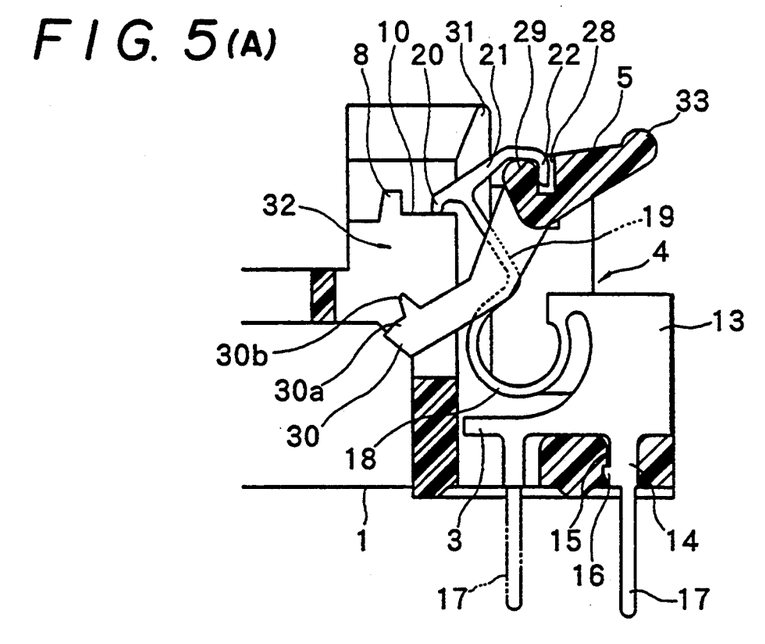
FIGS. 5(A) and 5(B) are cross-sectional views taken on line A—A of FIG. 2, FIG. 5(A) showing the contact shutter lever in a closed condition, and FIG. 5(B) showing the contact shutter lever in an opened condition.
Figure 5B:
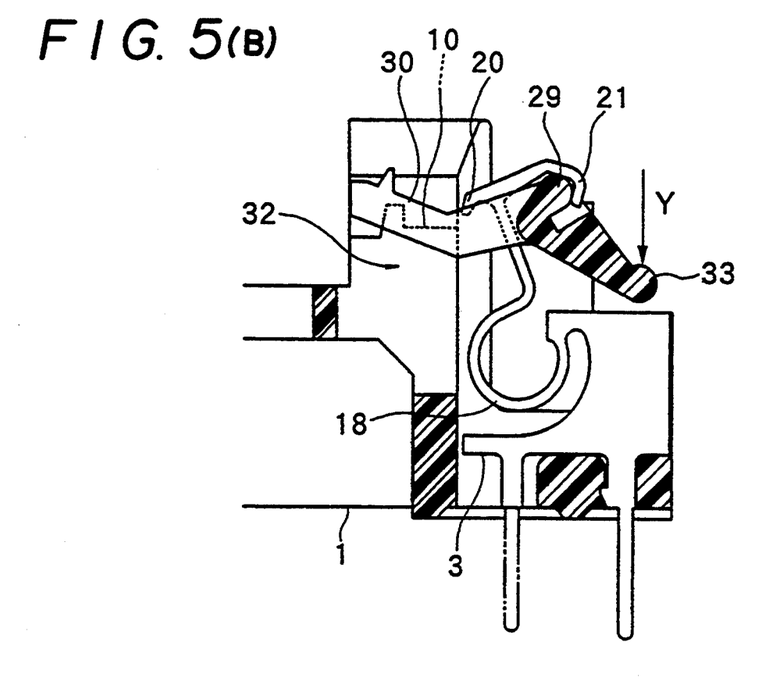

As shown in FIGS. 2 and 3, a molded socket body 1 of an electrically insulating material is provided at a central portion thereof with a generally square IC receiving portion 2 which opens upwardly and is capable of receiving therein an IC package 35 of FIGS. 2 and 5, as well as elsewhere. A plurality of contact members 3 are arranged in array on the socket body 1 along at least one pair of opposite sides of the IC receiving portion 2 in such a manner as to correspond to leads 35b of the IC package 35. The socket body 1 is equipped with a contact shutter member capable of displacing the contact members 3 between a contacting position where the contact members 3 are in contact with the leads 35b of the IC package 35 which has already been received in the IC receiving portion 2 and a releasing position. In this embodiment, contact shutter levers 5, which act as the contact shutter member, are pivotably supported by the socket body 1.

The IC receiving portion 2 is provided at an inner side of each array of the contact members 3 with a rib 8 lying in parallel relation to the array of the contact members. As shown in FIG. 6(C), the rib 8 is adapted to restrict that side surface of the IC package 35a from which the leads 35b project sidewardly. A foremost end of the lead 35b, which is bent in two steps to provide a crab-leg like configuration, is rested on a lead support surface 10 which is formed at a location outside the rib 8. A plurality of contact partition walls 6 are formed at a location outside the support surface 10 in such a manner as to be in parallel relation to the array of the contact members 3. A contacting portion 20, as well as adjoining portions of the contact member 3, is disposed in a slit 12 formed between adjacent partition walls 6.

The contact members 3 are arranged in array along the outside of the lead support surfaces 10, i.e, along the outside of the partition walls 6. Each contact member 3 has a support plate portion 13 which is supported on an upper surface of a contact implanting portion 4. For implanting, a press-in portion 14 projecting downwardly of the support plate portion 13 is press-fitted into a contact press-in hole 15 which is formed in the contact implanting portion 4. A terminal portion 17 projects downwardly from an inner end side or outer end side of the support plate portion 13, and the press-in portion 14 is formed on a basal portion of the terminal portion 17.

The contact member 3 has a curved spring portion 18 projecting inwardly (toward the IC receiving portion 2 side) from an upper position of the support plate portion 13 and having a generally three-quarter arcuate configuration. The contact member 3 further has an arm portion 19 extending linearly and obliquely upwardly while inclining inwardly and forwardly from the upper end of the curved spring portion 18. The upper end of the arm portion 19 extends to a position above the positional level of the lead support surface 10. The contacting portion 20 projects obliquely downwardly, i.e., toward the lead support surface 10, from the upper end of the arm portion 19. By putting this contacting portion 20, as well as adjoining portions of the contact member 3, into the slit 12, the upper end of the contact member 3 is restricted by the partition wall 6. The contact member 3 further has an arm portion 21 extending outwardly and obliquely upwardly from a connection area between the contacting portion 20 and the arm portion 19, and a hook portion 22 bent downwardly from the end portion of the arm portion 21.

Figure 4:
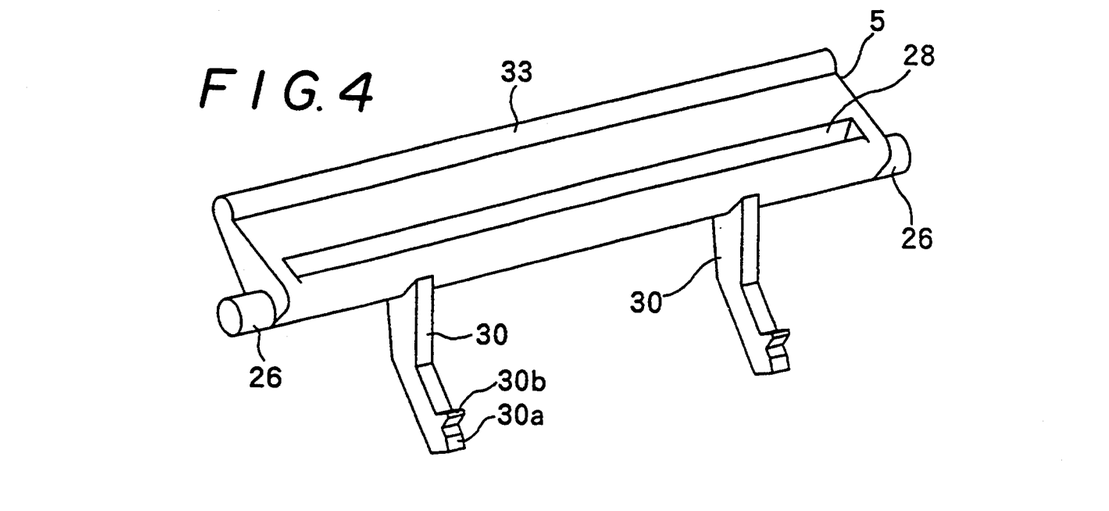
FIG. 4 is a perspective view showing a contact shutter lever according to the first embodiment of the present invention.

As shown in FIGS. 2 through 4, the contact shutter levers 5 extend along a pair of opposite sides, i.e., along and in parallel relation to the array of the contact members 3, of the IC receiving portion 2, and are pivotably supported on support shafts 26, respectively, which are, in turn, rotatably supported by bearing portions 27 projecting upwardly from opposite ends of the contact implanting portion 4, and which extend longitudinally of the levers 5 with both ends of the shafts 26 slightly projecting outwardly from opposite ends of the levers 5.

Each of the contact shutter levers 5 has an upwardly opening engagement groove 28 formed in the area in the vicinity of the support shaft 26 and along the array of the contact members 3. The lever 5 is provided at an inner end thereof with an operation portion 29 which has an arcuate surface along the engagement groove 28, and at an outer end thereof with a pressure receiving portion 33. The hook portion 22 of the contact member 3 is engaged in the engagement groove 28. When the pressure receiving portion 33 of the lever 3 is pivoted downwardly, the hook portion 22, is drawn by the operation portion 22 thereby displacing the contacting portion 20 of the contact member 3 rearwardly and outwardly against the spring portion 18 to realize the contact releasing condition. When the contact member 3 is displaced forwardly and inwardly by a restoring force of the spring portion 18, the operation portion 29 is drawn by the hook portion 22 and the pressure receiving portion 33 of the lever 5 is caused to pivot upwardly in order to bring the foremost end portion of the contacting portion 20 into abutment with the lead support surface 10.

The contact shutter lever 5 is provided with the lifters 30 integrally formed therewith and inwardly projecting between adjacent contact members 3 or through the array of the contact members 3. Each of the lifters 30, together with the adjacent contact members 3, passes through a wide slot 31 formed between the adjacent partition walls 6, and is inserted into a recess 32 formed in the lead support surface 10 so as to be in a lower position than the lead support surface 10.

A free end of lifter 30 is formed with an IC package placing portion 30a on which a lower surface of the body 35a of the IC package 35 is placed, and this IC package placing portion 30a is provided with a projection portion 30b adapted to position a side surface of the IC package body 35a.

The contact shutter lever 5 is provided at a rear end thereof with the pressure receiving portion 33. When the contact shutter lever 5 is pressed down to pivot about the support shaft 26 against the resiliency of the curved spring portion 18 by applying a press-down force as indicated by an arrow Y of FIG. 5(B) to the pressure receiving portion 33, the lifter 30 is pivoted upwardly about the support shaft 26 after passing through the slot 32 so as to be displaced to a position above the lead support surface 10, and the contacting portion 20 of the contact member 3 is moved outwardly and obliquely upwardly against resilience of the curved spring portion 18, so that the contacting portion 20 of the contact member 3 is displaced to the releasing position.

Figure 6A:
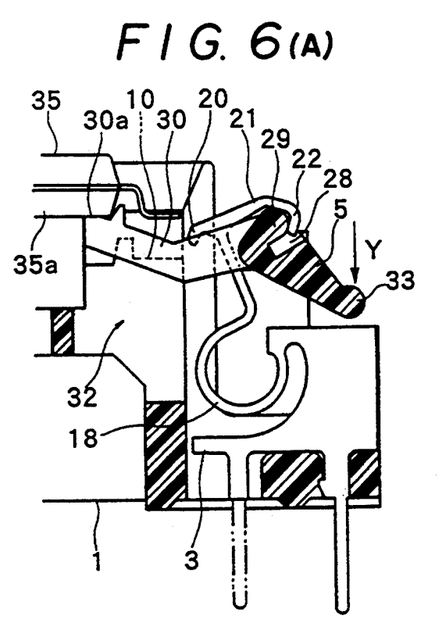
FIGS. 6(A)–6(C) are a cross-sectional views for explaining the operation of the first embodiment, FIG. 6(A) showing a state in which a lifter receives an IC package in an upper position, FIG. 6(B) showing a state in which the lifter places a lead of the IC package on a lead support surface during a displacing process to a lower position, and FIG. 6(C) showing a state in which a contact member is in contact with the lead of the IC package.

According to the above first embodiment, when the contact shutter lever 5 is opened against the resiliency of the curved spring portion 18 by applying the press-down force as indicated by the arrow Y of FIG. 6(A) to the pressure receiving portion 33 of the contact shutter member 5, the lifter 30 is displaced to the position above the lead support surface 10, and the hook portion 22 of the contact member 3 is caused to pull the operation portion 29 of the contact shutter lever 5 so that the contacting portion 20 is pulled rearwardly and obliquely upwardly so as to be displaced into the releasing position. In that condition, when the IC package 35a is placed on the IC package placing portion 30a of the lifter 30 from above, the body 35a of the IC package 35 is disposed between the positioning projection portions 30b of the lifter 30 so as to be positioned thereby.

Figure 6B:
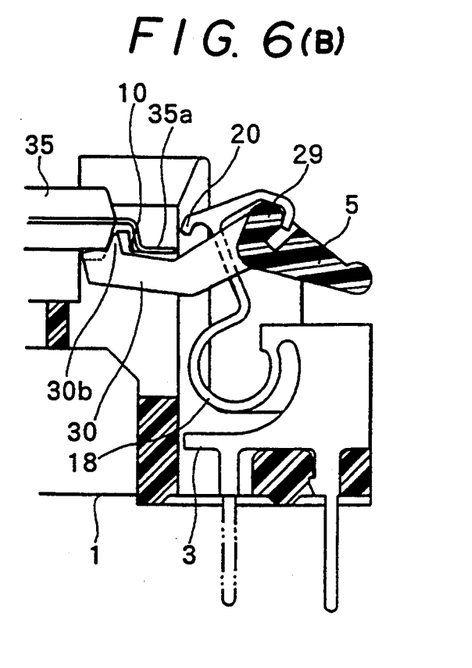
Figure 6C:
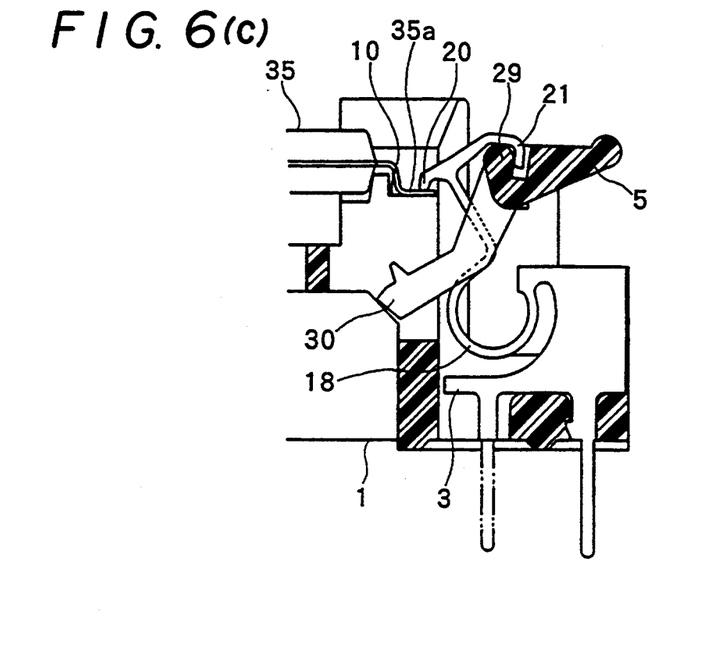
Figure 7:
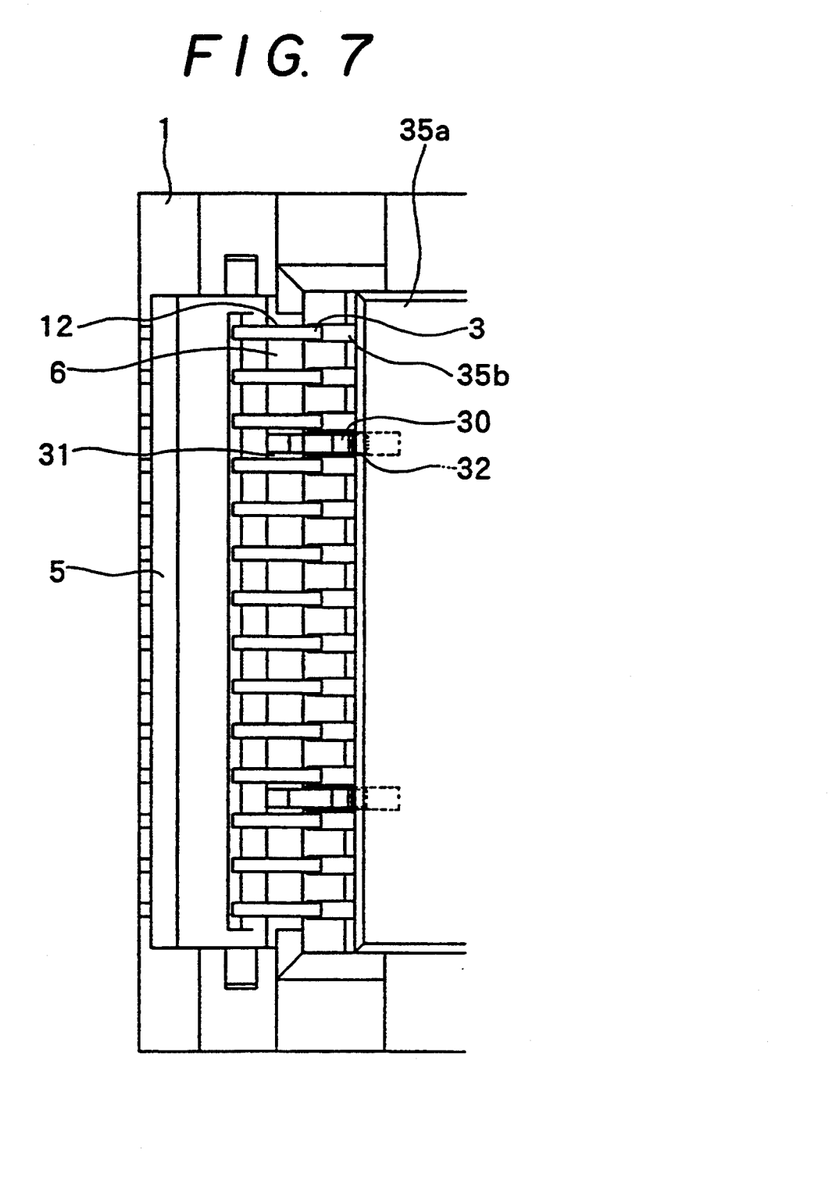
FIG. 7 is a plan view showing a state in which the contact member according to the first embodiment of the present invention is in contact with the lead of the IC package which has already been received in an IC package receiving portion.

Thereafter, when the press-down force to the contact shutter lever 5 is removed, the contact shutter lever 5 is pivoted upwardly by a restoring resiliency of the curved spring portion 18. During this pivoting process, as shown in FIG. 6(B), the contacting portion 20 of the contact member 3 is displaced forwardly and obliquely downwardly toward the contacting position from the above-mentioned releasing position and the lifter 30 is displaced from the position above the contacting position (from above the lead support surface 10) to the position below the contacting position, so that the contacting portion 20 of the contact member 3 is brought into contact with a foremost end portion of the lead placed on the lead support surface 10. Before this contacting operation, the lifter 30 is displaced to the lower position below the contacting position. During this process, the lifter 30 delivers the IC package 35 onto the support platform 2a. That is, the lead 35b is placed on the lead support surface 10, so as to correctly correspond in position to the contacting portion 20 of the contact member 3 as shown in FIG. 7.

The subsequent closing operation of the contact shutter lever 5 causes the lifter 30 to be displaced to a position below the lead support surface 10 (contacting position) after passing through the slot 32, and the contacting portion 20 of the contact member 3 is displaced forwardly and obliquely downwardly due to the restoring resiliency of the curved spring portion 18, so that the lead 35b is held between the contacting portion 20 and the lead support surface 10 so as to be in contact with the lead 35b.

Figure 8:
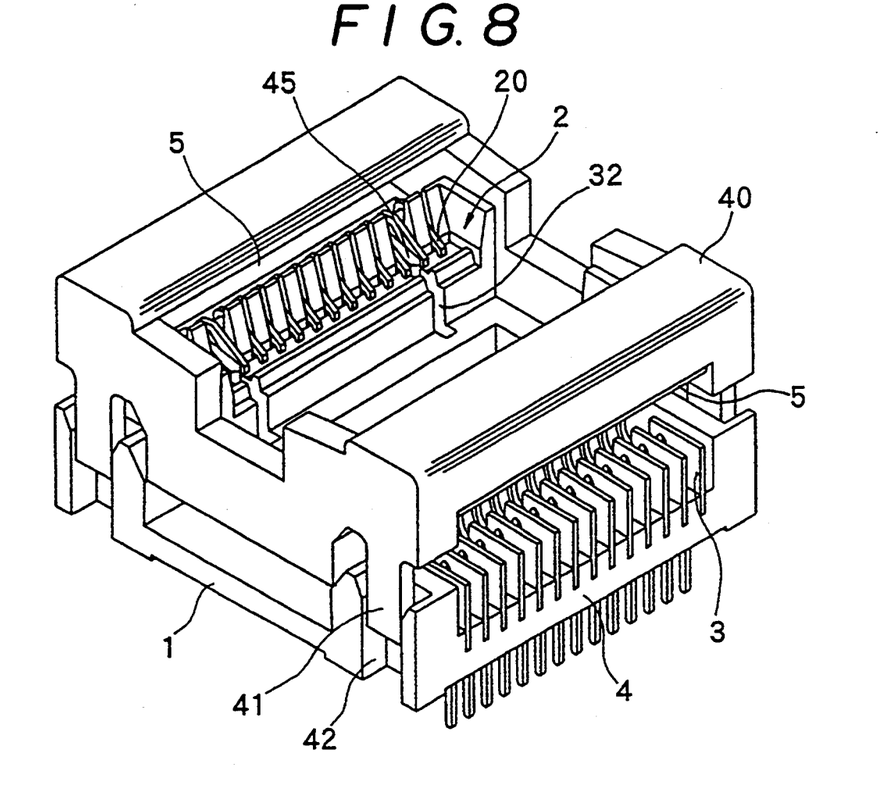
FIG. 8 is a perspective view showing an IC socket according to a second embodiment of the present invention.

In the above-mentioned first embodiment, the contact shutter lever 5 is directly pressed down by an automatic machine or a hand. As shown in FIG. 8, it may be designed such that a contact shutter cover 40 is mounted on the socket base 1 for movement upwardly and downwardly through guide portions 41 and 42, so that the pressing down of the contact shutter cover 40 directly by an automatic machine or a hand makes it possible to indirectly press down the pressure receiving portion 33 of the contact shutter lever 5.

Figure 9:
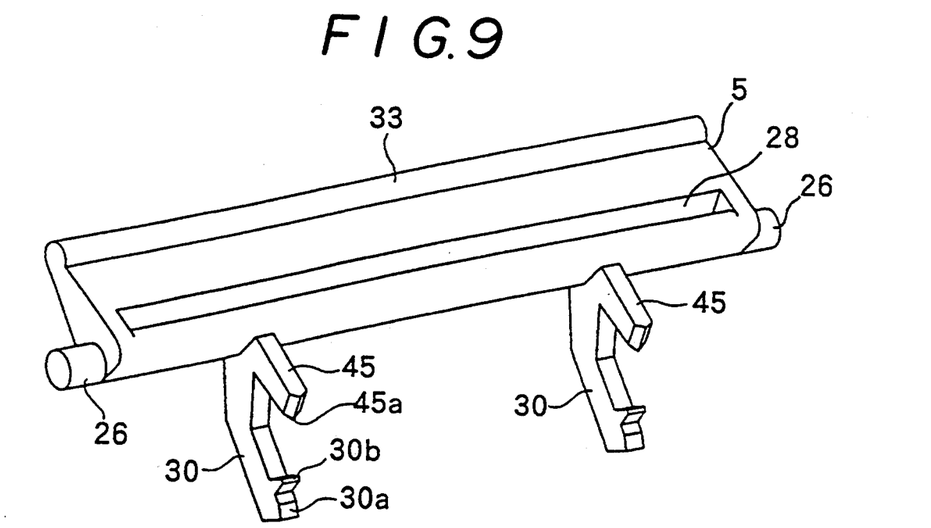
FIG. 9 is a perspective view showing a contact shutter lever according to a second embodiment of the present invention.
Figure 10A:
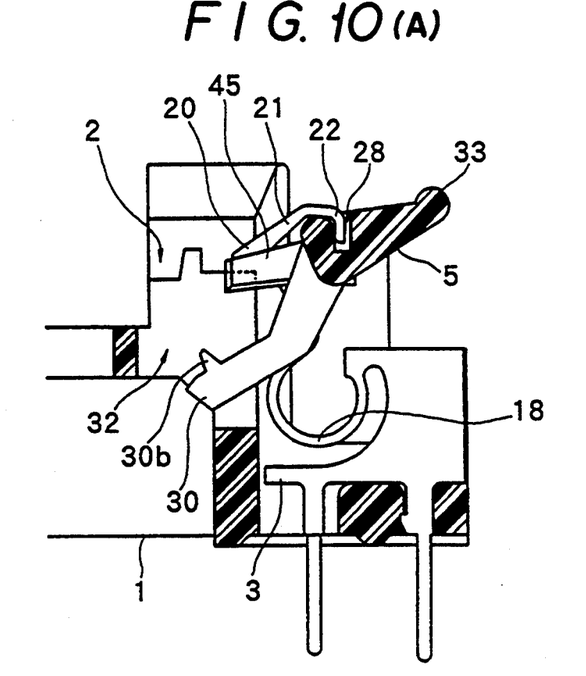
FIGS. 10(A) and 10(B) are cross-sectional views of a socket in which a contact shutter cover according to the second embodiment of the present invention is omitted, FIG. 10(A) showings a state in which the contact shutter lever is closed, and FIG. 10(B) showing a state in which the contact shutter lever is opened.
Figure 10B:
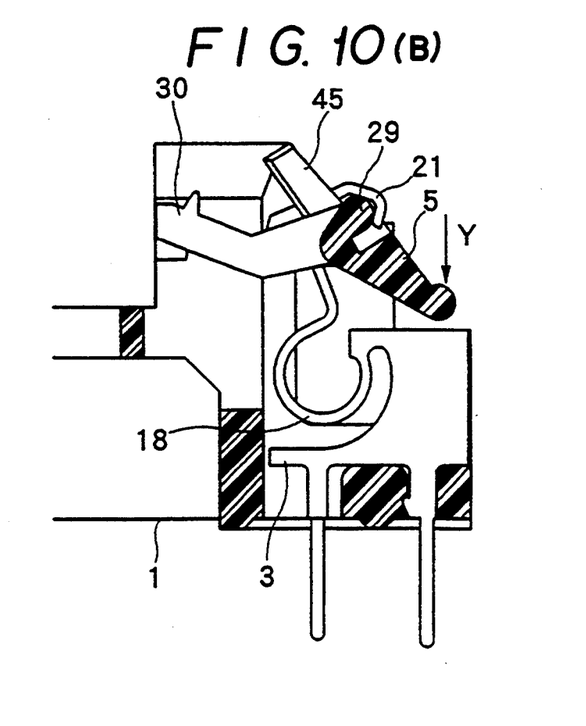

FIGS. 9 to 11 show a second embodiment of the present invention. The contact shutter lever 5 is provided, in addition to the lifter 30, with a knife-like positioning member 45. The arrangement is such that after the lifter 30 places the lead 35b of the IC package 35 on the lead support surface 10, the positioning member 45 is interposed between the leads 35b and presses the side surfaces of the leads so as to correctly position the leads 35b relative to the corresponding contact members 3. At the same time with or slightly later than this positioning operation, the contacting portion 20 is brought into press-contact with an upper surface of the lead 35b.

The positioning member 45 has a knife-edge 45a for guiding the insertion between the leads 35b.

Figure 11A:
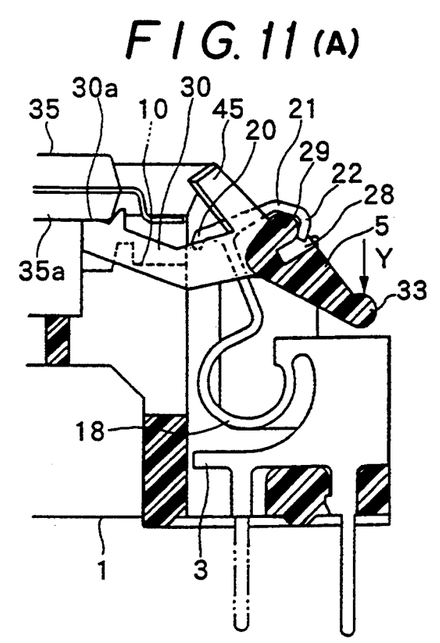
FIG. 11(A)-11(D) are cross-sectional views for explaining the operation of the second embodiment, FIG. 11(A) showing a state in which a lifter receives an IC package in an upper position, FIG. 11(B) showing a state in which the lifter places a lead of the IC package on a lead support surface during a displacing process to a lower position, FIG. 11(C) showing a state just prior to a contact member contacting with the lead of the IC package, and FIG. 11(D) showing a state in which the contact member is in contact with the lead of the IC package.

According to this second embodiment of the present invention, as shown in FIG. 11(A), by pressing down the pressure receiving portion 33 of the contact shutter lever 5 against the resiliency of the curved spring portion 18, the positioning member 45, the lifter 30 and the contacting portion 20 of the contact member 3 are displaced to the upper position.

Figure 11B:
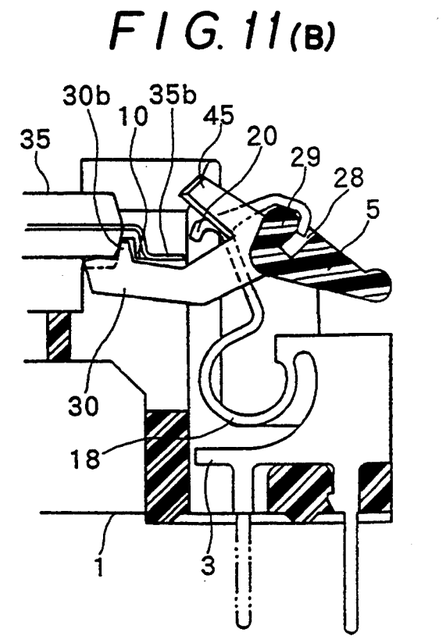
Figure 11C:
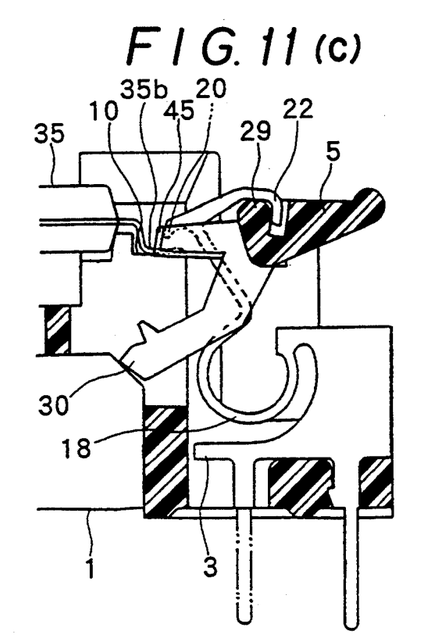
Figure 11D:
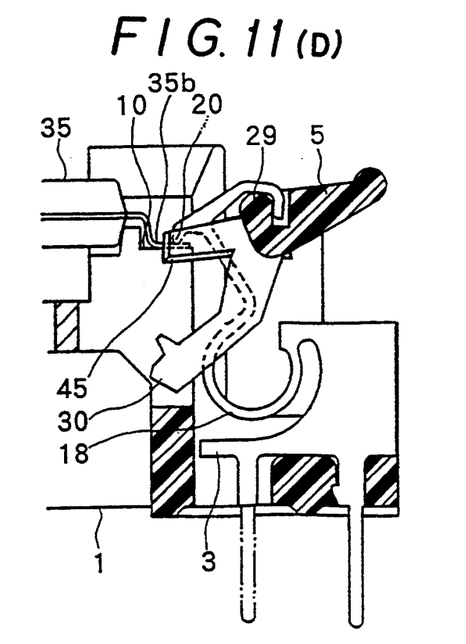

In that condition, when the press-down force to the contact shutter lever 5 is removed after the IC package body 35a is placed on the IC package placing portion 30a of the lifter 30, the contact shutter lever 5, as shown in FIG. 11(B), is pivoted upwardly due to the restoring resiliency of the curved spring portion 18. In response to this upward pivoting movement, the contacting portion 20 of the contact member 3, the lifter 30 and the positioning member 45 are displaced downwardly. With this feature, the lead 35b of the IC package 35 supported on the IC package placing portion 30a of the lifter 30 is placed on the lead support surface 10 without rebounding before the contacting portion 20 of the contact member 3 is brought into contact with the lead 35b. Moreover, as shown in FIG. 11(C), the positioning member 45 is interposed between the leads 35b and presses the side surfaces of the leads in order to correctly position the leads 35b relative to the corresponding contacting portions 20 before the contacting portions 20 are brought into contact with the leads 35b. After or at the same time as this positioning operation, the contacting portion 20 of the contact member 3 is brought into contact with the lead 35b as shown in FIG. 11(D).

The present invention may be designed, although not shown, such that the contact member, the lifter and the positioning member, for example, are pressed down directly by an automatic machine or the like, and these three component parts are operatively connected to one another.

The present invention also includes an embodiment in which the lifter is not integrally provided on the contact shutter member but is formed as a separate member from the shutter member, and both of these component parts are linked so as to be operatively connected to each other, and an embodiment in which the component parts are not linked but are operated by the contact shutter member and an automatic machine so as to be operatively connected to each other.

As described in the foregoing, according to the present invention, in an IC socket comprising a contact shutter member for displacing a contact member between a lead contacting position and a lead releasing position relative to a lead of an IC package, the lifter is operatively connected to the contact shutter member to receive the IC package in a position above the contacting position, and delivers and places the IC package onto a support platform of an IC package receiving portion during a process of being displaced to a position below the contacting position. Accordingly, the IC package can be correctly placed on the support platform of the IC package receiving portion without permitting the IC package to rebound, and the leads can be prevented from being deformed. As a result, the contacting condition between the contact members and the leads can easily and reliably be realized.

Furthermore, according to the present invention, by resiliently biasing the lifter in a lowering direction, the lifter, which has received the IC package in the upper position, is automatically lowered in order to deliver the IC package onto the IC package receiving portion.

Moreover, according to the present invention, by providing the positioning portion for restricting the IC package on the IC package placing portion of the lifter, the IC package can be more correctly placed in the IC package receiving portion by the lifter.

Furthermore, according to the present invention, by providing the lifter on the contact shutter member, the operative connection structure, in which the lifter delivers the IC package into the IC receiving portion before the contact members are brought into contact with the leads, can be significantly simplified and the operative connection can be ensured.

Moreover, according to the present invention, by providing, in addition to the lifter, the positioning member for restricting the IC package received in the IC package receiving portion before the contact members are brought into contact with the leads on the contact shutter member, the contacting condition between the contact members and the leads can be made more correctly.

Although several embodiments have been described, the present invention should by no means be limited to these embodiments. Many changes and modifications can be made without departing from the spirit of the present invention.

What is claimed is:

1. An IC socket for use with an IC package having an IC body and IC leads projecting therefrom, said IC socket comprising:

a socket body having an IC receiving portion and an IC support platform;

a plurality of contact members arranged along said IC receiving portion of said socket body, each of said contact members having an IC lead contacting portion movable between an IC lead contacting position and an IC lead releasing position;

a contact shutter member mounted to said socket body and operably connected to said contact members for moving said IC lead contacting portions between said IC lead contacting positions and said IC lead releasing positions;

an IC lifter operably connected to said contact shutter member and having an IC placing portion movable between an upper position located above said IC lead contacting positions of said IC lead contacting portions and a lower position located below said IC lead contacting positions of said IC lead contacting portions, said IC lifter being operable to receive an IC package when said IC placing portion is in said upper position and to deliver the IC package onto said support platform of said socket body during movement of said IC placing portion from said upper position to said lower position; and wherein said contact shutter member constitutes a means for moving said IC placing portion of said IC lifter from said upper position to said lower position.

2. An IC socket as recited in claim 1, wherein said contact members comprise spring portions, respectively, biasing said IC lead contacting portions toward said contacting positions, respectively.

3. An IC socket as recited in claim 2, wherein said spring portions are operable to bias said IC lifter toward said lower position.

4. An IC socket as recited in claim 1, wherein said IC lifter further comprises a projection portion projecting upwardly from said IC package placing portion.

5. An IC socket as recited in claim 1, wherein said IC lifter is fixed to said contact shutter member.

6. An IC socket as recited in claim 1, further comprising an IC positioning member operably connected to said contact shutter member for positioning the IC package relative to said contact members.

7. An IC socket as recited in claim 6, wherein said IC positioning member is movable between a lowered position in which it is disposed between the leads of an IC package when an IC package is present in said IC receiving portion, and a raised position; and said contact shutter member is further operable to move said IC positioning member into said lowered position upon moving said IC lead contacting portions into said IC lead contacting positions, and to move said IC positioning member into said raised position upon moving said IC lead contacting portions into said IC lead releasing positions.

8. An IC socket for use with an IC package having an IC body and IC leads projecting therefrom, said IC socket comprising:

a socket body having an IC body receiving surface and an IC lead supporting surface located about a periphery of said IC body receiving surface;

a plurality of contact members mounted to said socket body outwardly of said IC lead supporting surface, each of said contact members having an IC lead contacting portion movable between an IC lead contacting position in which said IC lead contacting portion presses against said IC lead supporting surface, and an IC lead releasing position spaced upwardly and outwardly from said IC lead contacting position;

a contact shutter member mounted to said socket body outwardly of said IC lead supporting surface, said contact shutter member being connected to said contact members;

an IC lifter mounted to and fixed for pivotal movement with said contact shutter member and extending inwardly from said contact shutter member, said IC lifter having an IC package placing portion at a free end thereof;

wherein said contact shutter member is pivotably mounted to said socket body for movement between a first position in which said IC package placing portion of said IC lifter is positioned above said IC body receiving surface, and a second position in which said IC package placing portion of said IC lifter is positioned below said IC body receiving surface; and wherein said contact members are connected to said contact shutter member in such a manner that said IC lead contacting portion is spaced upwardly and outwardly away from said IC lead supporting surface other than when said IC package placing portion of said IC lifter is located below said IC body receiving surface.

9. An IC socket as recited in claim 8, wherein said contact members comprise spring portions, respectively, biasing said IC lead contacting portions toward said contacting positions, respectively.

10. An IC socket as recited in claim 9, wherein said spring portions are operable to bias said contact shutter member toward said second position.

11. An IC socket as recited in claim 8, wherein said IC lifter further comprises a projection portion projecting upwardly from said IC package placing portion.

12. An IC socket as recited in claim 8, further comprising
an IC positioning member operably connected to said contact shutter member for positioning the IC package relative to said contact members.

13. An IC socket as recited in claim 12, wherein said IC positioning member is movable between a lowered position in which it is disposed between the leads of an IC package when an IC package is present on said IC receiving surface, and a raised position; and said contact shutter member is further operable to move said IC positioning member into said lowered position upon moving said IC lead contacting portions into said IC lead contacting positions, and to move said IC positioning member into said raised position upon moving said IC lead contacting portions into said IC lead releasing positions.

* * * * *